United States Patent
Tsai et al.

(10) Patent No.: US 9,361,980 B1
(45) Date of Patent: Jun. 7, 2016

(54) RRAM ARRAY USING MULTIPLE RESET VOLTAGES AND METHOD OF RESETTING RRAM ARRAY USING MULTIPLE RESET VOLTAGES

(71) Applicant: Taiwan Semiconductor Manufacturing Company Limited, Hsinchu (TW)

(72) Inventors: Chun-Yang Tsai, Hsinchu (TW); Hon-Jarn Lin, Hsinchu (TW); Kuo-Ching Huang, Hsinchu (TW); Yu-Wei Ting, Taipei (TW)

(73) Assignee: Taiwan Semiconductor Manufacturing Company Limited, Hsinchu (TW)

(*) Notice: Subject to any disclaimer, the term of this patent is extended or adjusted under 35 U.S.C. 154(b) by 0 days.

(21) Appl. No.: 14/620,352

(22) Filed: Feb. 12, 2015

(51) Int. Cl.
*G11C 11/00* (2006.01)
*G11C 13/00* (2006.01)

(52) U.S. Cl.
CPC ........ *G11C 13/0097* (2013.01); *G11C 13/0064* (2013.01)

(58) Field of Classification Search
CPC .................. G11C 13/0097; G11C 13/0064
USPC ............................. 365/148, 185.22
See application file for complete search history.

(56) References Cited

U.S. PATENT DOCUMENTS

| | | | | | |
|---|---|---|---|---|---|
| 5,673,223 | A | * | 9/1997 | Park | G11C 16/08 365/185.11 |
| 6,975,542 | B2 | * | 12/2005 | Roohparvar | G11C 16/0483 365/185.22 |
| 8,923,060 | B2 | * | 12/2014 | Shim | G11C 16/30 365/185.17 |
| 9,058,857 | B2 | * | 6/2015 | Liu | G11C 13/0038 |
| 2015/0085558 | A1 | * | 3/2015 | Chang | G11C 13/0002 365/148 |
| 2015/0109849 | A1 | * | 4/2015 | Tsai | G11C 13/0069 365/148 |
| 2015/0179260 | A1 | * | 6/2015 | Sharon | G11C 14/0045 711/105 |

* cited by examiner

*Primary Examiner* — Viet Q Nguyen
(74) *Attorney, Agent, or Firm* — Jones Day

(57) ABSTRACT

According to another embodiment, a method of reset operation for a resistive random access memory (RRAM) array, having a first RRAM connected to a first word line and a second RRAM connected to a second word line, is provided. A first electrical resistance between the first word line and a word line voltage source is lower than a second electrical resistance between the second word line and the word line voltage source. The method includes: providing a first voltage by using the word line voltage source for resetting the first RRAM; and providing a second voltage by using the word line voltage source for resetting the second RRAM, wherein the first voltage for resetting the first RRAM is lower than the second voltage for resetting the second RRAM.

20 Claims, 12 Drawing Sheets

$V_{WL\_Low} < V_{WL\_High} \leq V_{WL\_High'}$ ; $V_{SL\_Low} < V_{SL\_High} \leq V_{SL\_High'}$ , i & j > 0, k...etc ≥ 0

If Ir < Ir 0 Criteria → Reset passed

600

Operation Condition for Front-Side     210

| Operation | | Composite-Reset | |
|---|---|---|---|
| | | Loop-1 | Loop-2 |
| WL | Selected | $V_{WL\_low} > 0$ (2.5V) | $V_{WL\_high}$(2.6V) $> V_{WL\_low}$ |
| | Unselected | 0 | 0 |
| BL | Selected | 0 | 0 |
| | Unselected | 0 | 0 |
| SL | Selected | $V_{SL\_high} > 0$ (1.6V) | $V_{SL\_low}$(1.5V) $< V_{SL\_high}$ |
| | Unselected | 0 | 0 |

Operation Condition for Back-Side     220

| Operation | | Composite-Reset | |
|---|---|---|---|
| | | Loop-1 | Loop-2 |
| WL | Selected | $V_{WL\_low} > 0$ (2.7V) | $V_{WL\_high}$(2.8V) $> V_{WL\_low}$ |
| | Unselected | 0 | 0 |
| BL | Selected | 0 | 0 |
| | Unselected | 0 | 0 |
| SL | Selected | $V_{SL\_high} > 0$ (1.7V) | $V_{SL\_low}$(1.6V) $< V_{SL\_high}$ |
| | Unselected | 0 | 0 |

Fig. 2

Operation Condition for Front-Side

| Operation | | Composite-Reset |
|---|---|---|
| WL | Selected | $V_{WL\_low} \leq V_{WL\_high} \leq V_{WL\_high'}$ (1.3V~1.8V) |
| | Unselected | 0 |
| BL | Selected | $V_{BL\_m}$ & $V_{BL\_n}$ & $V_{BL\_p}$ (1.2V~2.5V) |
| | Unselected | 0 |
| SL | Selected | 0 |
| | Unselected | 0 |

⎭ 710

Operation Condition for Bsck-Side

| Operation | | Composite-Reset |
|---|---|---|
| WL | Selected | $V_{WL\_low} \leq V_{WL\_high} \leq V_{WL\_high'}$ (1.4V~1.9V) |
| | Unselected | 0 |
| BL | Selected | $V_{BL\_m}$ & $V_{BL\_n}$ & $V_{BL\_p}$ (1.3V~2.6V) |
| | Unselected | 0 |
| SL | Selected | 0 |
| | Unselected | 0 |

RRAM ARRAY USING MULTIPLE RESET VOLTAGES AND METHOD OF RESETTING RRAM ARRAY USING MULTIPLE RESET VOLTAGES

BACKGROUND

Resistive random access memory (RRAM) is one possible candidate for next generation nonvolatile memory technology due to its simple and CMOS logic compatible process. The RRAM cell includes a metal oxide material sandwiched between top and bottom electrodes. By applying voltage to the RRAM cell, a switching event from high resistance state (HRS) to low resistance state (LRS) occurs and is called the "set" operation. Conversely, a switching event from LRS to HRS is called the "reset" operation. The low and high resistances are utilized to indicate a digital signal, "1" or "0", thereby allowing for data storage.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 is an exemplary table of the reset operations of the RRAM cells 110, 150 of the RRAM array 100 in FIG. 1 in accordance with some embodiments.

FIG. 7 is an exemplary table of the set operations of the RRAM cells 110, 150 of the RRAM array 100 in FIG. 1 in accordance with some embodiments.

DETAILED DESCRIPTION

Figure 1:
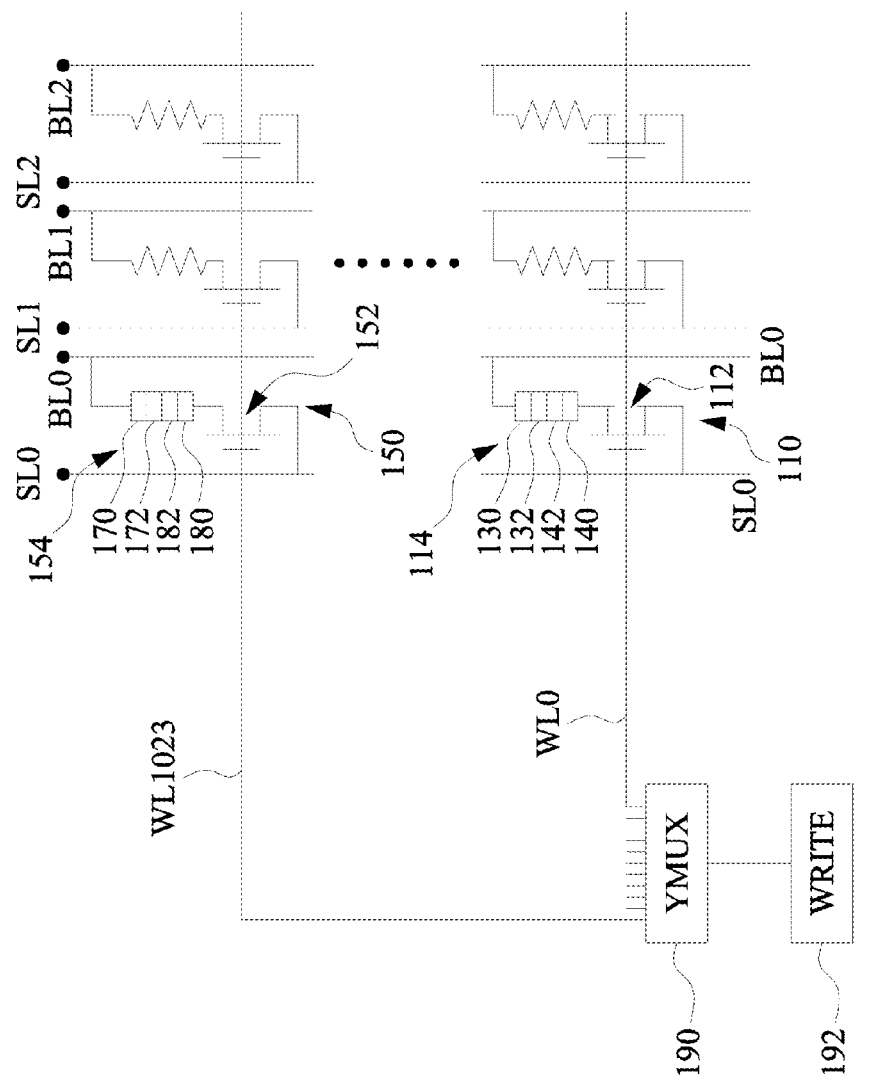
FIG. 1 is a block diagram of an exemplary resistive random access memory in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

This disclosure includes a word line address dependent biasing scheme for different word line addresses for compensating a voltage drop due to wire resistance. For those RRAM cells connected to front-side word lines (closer to a word line voltage source), less voltage compensation is provided by the word line voltage source; for those RRAM cells connected to back-side word lines (more distant from the word line voltage source), more voltage compensation is provided by the word line voltage source.

The word lines are connected to the word line voltage source via a multiplexer. A front-side word line is closer to the word line voltage source than a back-side word line. That is, the wire connected between the back side word line and the word line voltage source is longer than the wire connected between the front-side word line and the word line voltage source, resulting in the electrical resistance between the back-side word line and the word line voltage source being higher than the electrical resistance between the front-side word line and the word line voltage source.

In order to enhance longevity and lower the error rate of an RRAM array, a word line address dependent biasing scheme is applied to the RRAM. The word line address dependent biasing includes providing different biases to word lines and source lines for resetting the RRAM. The word line voltage source provides a voltage for resetting the first RRAM connected to the front-side word line; the word line voltage source provides a higher voltage for resetting the second RRAM connected to the back-side word line. This configuration compensates the higher voltage drop resulting from greater electrical resistance between the back-side word line and the word line voltage source. Additionally, a source line voltage source provides a voltage for resetting the first RRAM connected to the first word line; the source line voltage source provides a higher voltage for resetting the second RRAM connected to the second word line. This configuration also improves transition of the resistor of the second RRAM from set to reset that would otherwise be degraded by the lower voltage at the gate of the transistor of the second RRAM.

The word line address dependent biasing includes providing different biases to word lines and bit lines for setting the RRAM. The word line voltage source provides a voltage for setting the first RRAM connected to the front-side word line; the word line voltage source provides a higher voltage for setting the second RRAM connected to the back-side word line. This configuration compensates the higher voltage drop resulting from greater electrical resistance between the back-side word line and the word line voltage source. Additionally, a bit line voltage source provides a voltage for setting the first RRAM connected to the first word line; the bit line voltage source provides a higher voltage for setting the second RRAM connected to the second word line. This configuration also improves transition of the resistor of the second RRAM from reset to set that would otherwise be degraded by the lower voltage at the gate of the transistor of the second RRAM.

A composite reset scheme may be applied to the RRAM array. The composite reset scheme includes several reset loops (e.g., two loops). When the first reset loop does not succeed in switching from LRS to HRS, a second reset loop with a higher word line voltage and a lower source line voltage than the first reset loop will be utilized. As a result, in the second operation loop, higher word line voltage increases the current which flows through the variable resistor, and lower source line voltage decreases the stress on the variable resistor. As such, the reset scheme can speed up the reset operation without damaging the RRAM.

FIG. 1 is a block diagram of an exemplary resistive random access memory in accordance with some embodiments. As shown in FIG. 1, an RRAM (resistive random access memory) array 100 is provided. The RRAM array 100 may include a plurality of RRAM cells. In the embodiment, we take a first RRAM cell 110 and a second RRAM cell 150 as an example. The first RRAM cell 110 includes a first transistor 112 and a first variable resistor 114. The second RRAM cell 150 includes a second transistor 152 and a second variable resistor 154.

The gate of the first transistor 112 of the first RRAM cell 110 is connected to the front-side word line WL0 of the word lines WL0-WL1023, and the gate of the second transistor 152 of the second RRAM cell 150 is connected to the back-side word line WL1023 of the word lines WL0-WL1023. The word lines WL0, WL1023 are both connected to the word line voltage source (WRITE) 192 via a multiplexer (YMUX) 190.

Furthermore, the first variable resistor 114 includes a cap side electrode 130, a dielectric side electrode 140, a cap layer 132, and a dielectric layer 142. The cap layer 132 is in electrical contact with the cap side electrode 130; the dielectric layer 142 is in electrical contact with the dielectric side electrode 140. A source line voltage source (not shown) is electrically connected to the source line SL0. A bit line voltage source (not shown) is electrically connected to the bit line BL0.

The cap side electrode 130 and the dielectric side electrode 140 may be made of metal, metal nitride, or doped-poly, for example, Al, Ti, Ta, Au, Pt, W, Ni, Ir, TiN, TaN, n-doped poly, p-doped poly. The cap layer 132 may be made of metal or metal-oxide, for example, Al, Ti, Ta, Hf, TiOx, HfOx, ZrOx, GeOx, CeOx. In some embodiments, the first variable resistor 114 does not include the cap layer 132.

In the embodiment, the gate of the first transistor 112 of the first RRAM cell 110 is electrically connected to the front-side word line WL0. The drain of the first transistor 112 of the first RRAM cell 110 is electrically connected to the dielectric side electrode 140 of the first variable resistor 114. The source of the first transistor 112 of the first RRAM cell 110 is electrically connected to a first source line SL0. The cap side electrode 130 of the first variable resistor 114 is electrically connected to a first bit line BL0. The second RRAM cell 150 includes the second transistor 152 and the second variable resistor 154, wherein the second transistor 152 includes a cap side electrode 170, a dielectric side electrode 180, a cap layer 172, and a dielectric layer 182. The second RRAM cell 150 is configured similar to the first RRAM cell 110, and is not repeated herein.

Referring to FIG. 1, the front-side word line WL0 is closer to the word line voltage source WRITE 192 than the back-side word line WL1023 is. That is, the wire connected between the back-side word line WL1023 and the word line voltage source WRITE 192 is longer than the wire connected between the front-side word line WL0 and the word line voltage source WRITE 192, resulting in the electrical resistance between the back-side word line WL1023 and the word line voltage source WRITE 192 being higher than the electrical resistance between the front-side word line WL0 and the word line voltage source WRITE 192. If the word line voltage source WRITE 192 generates the same voltage (e.g., about 2.5V) for applying to the word lines WL0, WL1023, the voltage (e.g., about 2.3V) that the back-side word line WL1023 receives is lower than the voltage (e.g., about 2.5V) that the front-side word line WL0 receives due to the higher voltage drop resulting from the greater electrical resistance between the back-side word line WL1023 and the word line voltage source WRITE 192.

In order to enhance longevity and lower the error rate of an RRAM array, a word line address dependent biasing scheme is applied to the RRAM cells 110, 150. The word line address dependent biasing scheme includes providing different biases to word lines WL0, WL1023 for resetting the RRAM cells 110, 150. The word line voltage source WRITE 192 provides a voltage (e.g., about 2.5V) for resetting the first RRAM 110 connected to the front-side word line WL0; the word line voltage source provides a higher voltage (e.g., about 2.7V) for resetting the second RRAM 150 connected to the back-side word line WL1023. This configuration compensates higher voltage drop resulting from greater electrical resistance between the back-side word line WL1023 and the word line voltage source WRITE 192. FIG. 2 is an exemplary table of the reset operations of the RRAM cells 110, 150 of the RRAM array 100 in FIG. 1 in accordance with some embodiments. The term "Selected" refers to those word lines, bit lines, and source lines that are connected to the RRAM cell to be reset. The term "Unselected" refers to those word lines, bit lines, and source lines that are not connected to the RRAM to be reset.

In order to enhance longevity and lower the error rate of the RRAM array 100, a word line address dependent biasing scheme for the reset operation is applied. Refer to the first operation loop (Loop 1) in the operation conditions 210, 220 in FIG. 2. In the operation condition 210 for resetting the first RRAM cell 110, the first RRAM cell 110 is selected while the second RRAM cell 150 is not. In the operation condition 220 for resetting the second RRAM cell 150, the second RRAM cell 150 is selected while the first RRAM cell 110 is not. For example, the word line address dependent biasing includes providing different biases to the word lines WL0, WL1023 and the source line SL0 for resetting the RRAM. The word line voltage source 192 provides a voltage (e.g., about 2.5V) for resetting the first RRAM cell 110 when the front-side word line WL0 is selected; the word line voltage source provides a higher voltage (e.g., about 2.7V) for resetting the second RRAM when the back-side word line WL1023 is selected. This configuration compensates higher voltage drop resulting from greater electrical resistance between the back-side word line WL1023 and the word line voltage source 192.

Additionally, a source line voltage source provides a voltage (e.g., about 1.6V) for resetting the first RRAM cell 110 when the source line SL0 is selected; the source line voltage source provides a higher voltage (e.g., about 1.7V) for resetting the second RRAM cell 150 when the source line SL0 is selected. This configuration also improves transition of the resistor 154 of the second RRAM 150 from set to reset that would otherwise be degraded by the lower voltage at the gate of the transistor 152 of the second RRAM 150.

Furthermore, a composite reset scheme include several reset loops (e.g., about two loops) that may be applied at the same time. Please refer to the second operation loop (Loop 2) in the operation conditions 210, 220 in FIG. 2. For example, the word line address dependent biasing includes providing different biases to word lines WL0, WL1023 and the source line SL0 for resetting the RRAM. The word line voltage source 192 provides a voltage (e.g., about 2.6V) for resetting the first RRAM cell 110 when the front-side word line WL0 is selected; the word line voltage source provides a higher voltage (e.g., about 2.8V) for resetting the second RRAM when the back-side word line WL1023 is selected. This configuration compensates the higher voltage drop resulting from greater electrical resistance between the back-side word line WL1023 and the word line voltage source 192. Additionally, a source line voltage source provides a voltage (e.g., about 1.5V) for resetting the first RRAM cell 110 when the source line SL0 is selected; the source line voltage source provides a higher voltage (e.g., about 1.6V) for resetting the second RRAM cell 150 when the source line SL0 is selected. This configuration also improves transition of the resistor 154 of the second RRAM 150 from set to reset that would otherwise be degraded by the lower voltage at the gate of the transistor 152 of the second RRAM 150.

A ground voltage is applied during the reset operation in both the first operation loop and the second operation loop to the selected bit line BL0. A ground voltage is applied during the reset operation in both the first operation loop and the second operation loop to the unselected word lines, the unselected bit lines, and the unselected source lines.

Figure 3:
FIG. 3 is an exemplary waveform of the word line voltage source, the bit line voltage source, and the source line voltage source of the RRAM array 100 in FIG. 1 associated with the word line addresses in accordance with some embodiments.

FIG. 3 is an exemplary waveform of the word line voltage source, the bit line voltage source, and the source line voltage source of the RRAM array 100 in FIG. 1 associated with the word line addresses in accordance with some embodiments. As shown in FIG. 3 and referring to the configuration of FIG. 1, a set of waveforms of a reset operation 300 is provided. The reset operation 300 includes at least three configurations: a SL-bias compensation 310; a WL-bias compensation 320; and a WL&SL-bias compensation 330.

In the SL-bias compensation 310 of the reset operation 300, the word line voltage source 192 provides a constant voltage. The source line voltage source provides n incremental voltage steps associated with the word line addresses. The bit line voltage source provides ground. This configuration improves transition of the resistor 154 of the second RRAM 150 from set to reset that would otherwise be degraded by the lower voltage at the gate of the transistor 152 of the second RRAM 150.

In the WL-bias compensation 320 of the reset operation 300, the word line voltage source 192 provides m incremental voltage steps associated with the word line addresses. The source line voltage source provides a constant voltage. The bit line voltage source provides ground. This configuration compensates the higher voltage drop resulting from greater electrical resistance between the back-side word line WL1023 and the word line voltage source 192.

In the WL&SL-bias compensation 330 of the reset operation 300, the word line voltage source 192 provides m incremental voltage steps associated with the word line addresses. The source line voltage source provides n incremental voltage steps associated with the word line addresses as well. The bit line voltage source provides ground. This configuration combines the advantages of two above-mentioned configurations.

Figure 4:
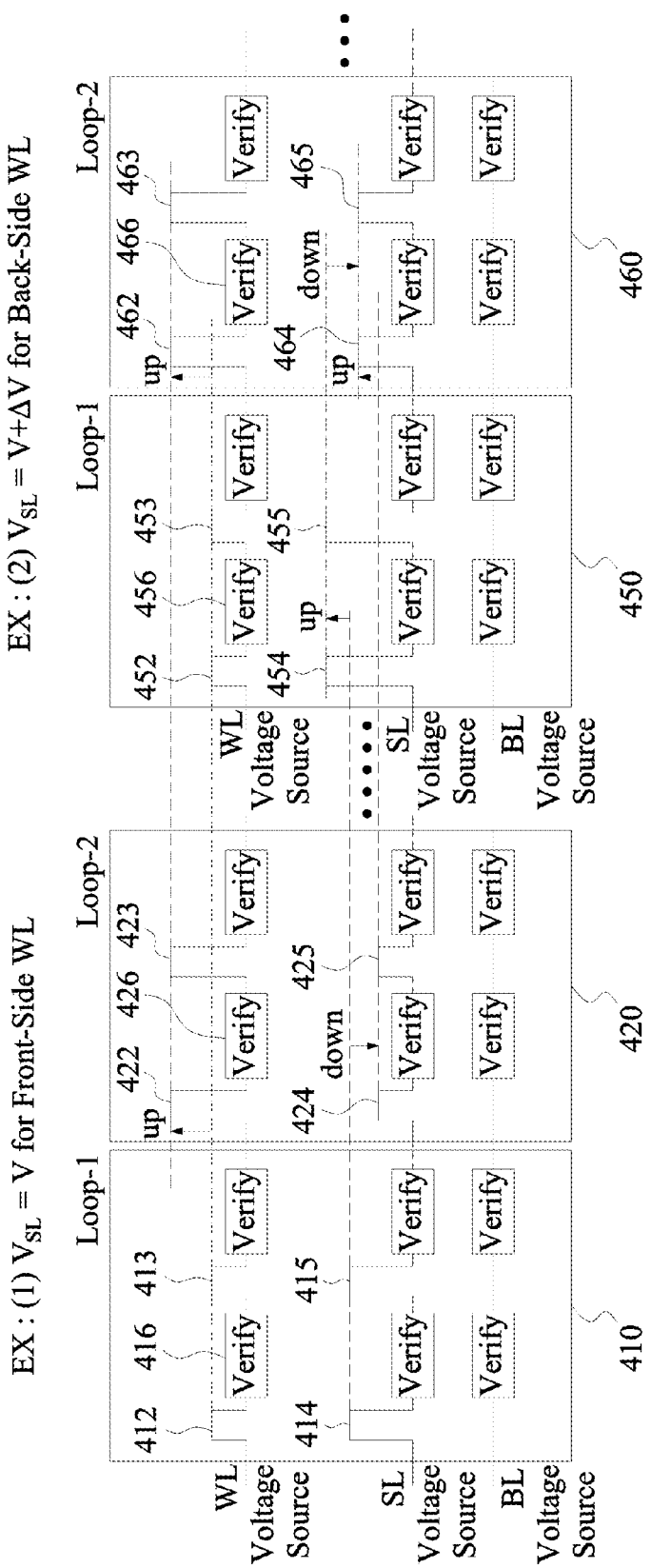
FIG. 4 is an exemplary waveform of the word line voltage source, the bit line voltage source, and the source line voltage source of the RRAM array 100 in FIG. 1 associated with the word line addresses in accordance with some embodiments.

FIG. 4 is an exemplary waveform of the word line voltage source, the bit line voltage source, and the source line voltage source of the RRAM array 100 in FIG. 1 associated with the word line addresses in accordance with some embodiments. As shown in FIG. 4 and referring to the configuration of FIG. 1, a set of waveforms of a reset operation 400 is provided. The reset operation 400 includes two configurations: reset loops 410, 420 for the front-side word line WL0; and reset loops 450, 460 for the back-side word line WL1023.

In the reset loop 410 for the front-side word line WL0, the word line voltage source 192 provides pulses 412, 413 (e.g., about 2.5V) and the source line voltage source provides pulses 414, 415 (e.g., about 1.6V). After each of the pulses (e.g., 412 and 414) for the reset operation, a verification period 416 follows. In the reset loop 420 for the front-side word line WL0, the word line voltage source 192 provides pulses 422, 423 (e.g., about 2.6V) and the source line voltage source provides pulses 424, 425 (e.g., about 1.5V). After each of the pulses (e.g., 422 and 424) for the reset operation, a verification period 426 follows. In the reset loop 450 for the back-side word line WL1023, compared to the reset loop 410, the source line voltage source provides higher pulses 454, 455 (e.g., about 1.7V), while the word line voltage source provides the same pulses 452, 453 (e.g., about 2.5V). In the reset loop 460 for the back-side word line WL1023, compared to the reset loop 420, the source line voltage source provides higher pulses 464, 465 (e.g., about 1.6V), while the word line voltage source provides the same pulses 462, 463 (e.g., about 2.6V).

Figure 5:
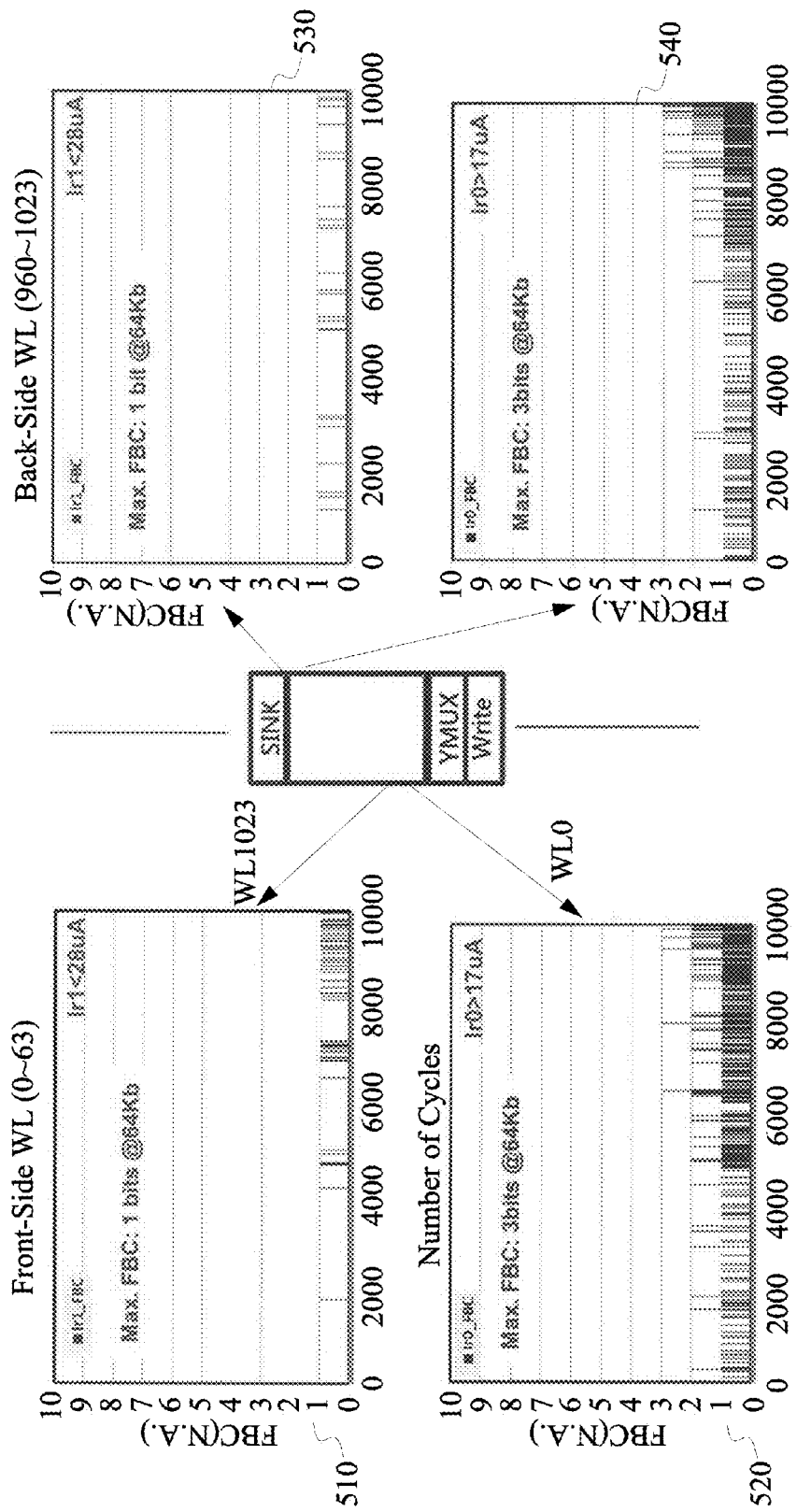
FIG. 5 shows experimental results of performing the resetting operation by using the configuration shown in FIGS. 1 and 2 in accordance with some embodiments.

FIG. 5 shows experimental results of performing the resetting operation by using the configuration shown in FIGS. 1 and 2 in accordance with some embodiments. FIG. 5 includes the results 510, 520 for the cells connected to the front-side word line WL0 and the results 530, 540 for the cells connected to the back-side word line WL1023. In each of the results, x-axis refers to the number of test cycles; y-axis refers to FBC (failing bit counts), wherein the lower the FBC, the less the error rate of the cells. Furthermore, in FIG. 5, Ir0 and Ir1 denote distributions and average values of electric currents required upon reading. Ir0 with a small electric current amount corresponds to the reading of the high resistance state ("0" information) and Ir1 with a large electric current amount corresponds to the reading of the low resistance state ("1" information). It is demonstrated that by using the configuration shown in FIGS. 1 and 2, the cells connected to back-side word line WL1023 has the same performance (e.g., the same max FBC for Ir0 and Ir1) as those connected to back-side word line WL1023.

Figure 6:
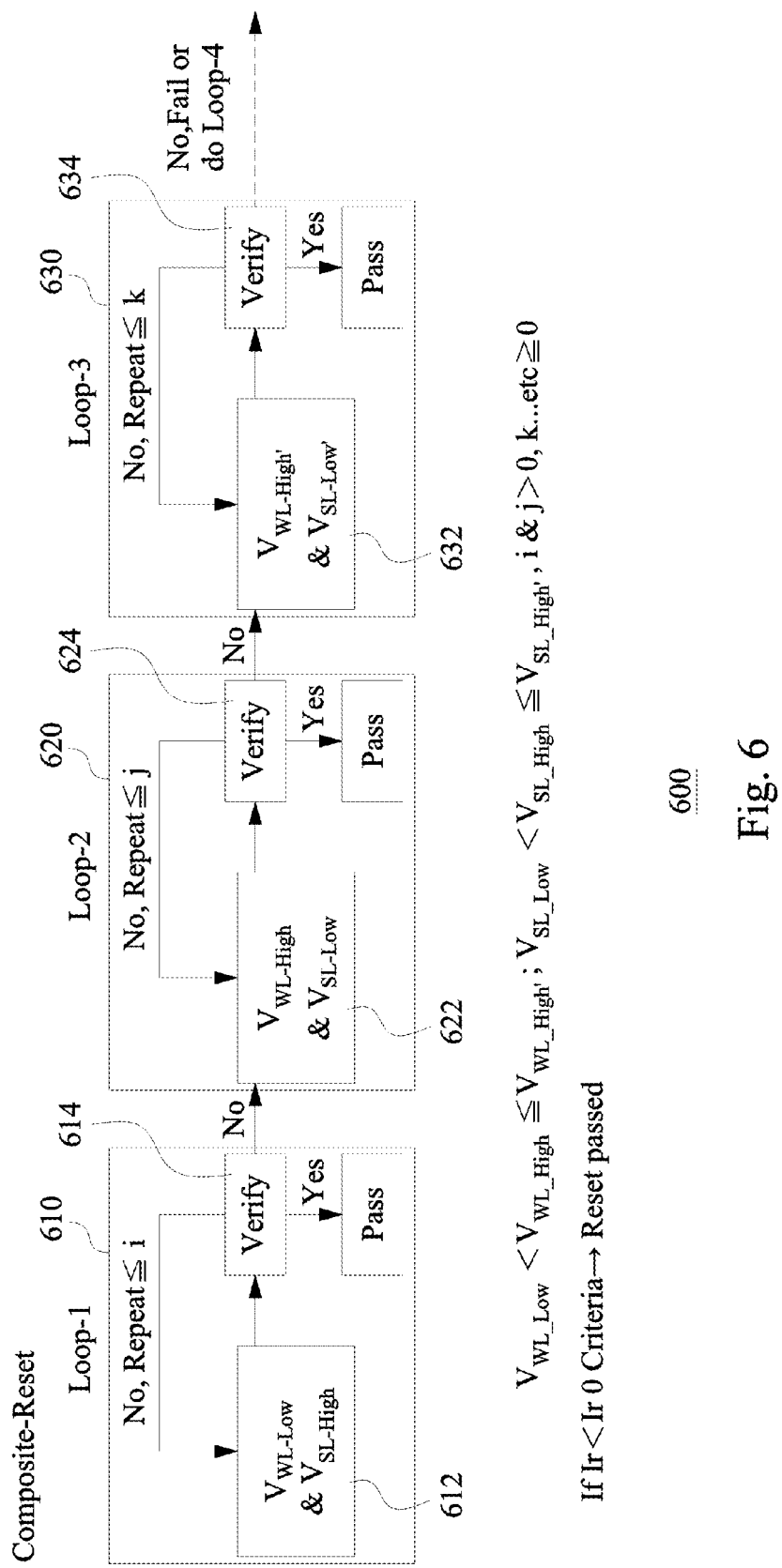
FIG. 6 is an exemplary block diagram of a reset configuration for the reset scheme 600 in FIG. 6 during consecutive reset loops in accordance with some embodiments.

FIG. 6 is an exemplary block diagram of a reset configuration for the reset scheme 600 in FIG. 6 during consecutive reset loops in accordance with some embodiments. As shown in FIG. 6, a reset configuration 600 is provided. The reset configuration 600 includes operation loops 610, 620, and 630. In some embodiments, the reset configuration 600 may include more operation loops. The reset configuration 600 can be applied to the cells connected to the front-side word lines and those connected to the back-side word lines.

As shown in FIGS. 1, 4 and 6, for the cells connected to the front-side word lines, the reset algorithm 600 may be applied and start from the first operation loop 610. The first operation loop 610 utilizes a first voltage source 612 including multiple voltage sources and a first verifier 614. The first voltage source 612 provides the pulses 412-415 to the RRAM array 100 to be reset. The first verifier 614 is electrically connected to the first variable resistor 114 and verifies whether the first variable resistor 114 is reset. If the first variable resistor 114 is not reset, the first verifier 614 requests the first voltage source 612 to repeat. When the verification conducted by the first verifier 614 occurs more than i times (i>0, for example, i=4), the second operation loop 620 starts.

The second operation loop 620 utilizes a second voltage source 622 including multiple voltage sources and a second verifier 624. The second voltage source 622 provides the pulses 422-425 to the RRAM 100 to be reset. The second verifier 624 is connected to the first variable resistor 114 and verifies whether the first variable resistor 114 is reset. If the first variable resistor 114 is not reset, the second verifier 624 requests the second voltage source 622 to repeat. When the verification conducted by the second verifier 624 occurs more than j times (j>0, for example, j=6), the third operation loop 630 starts. The third operation loop 630 works similar to the first operation loop 610 and the second operation loop 620, providing higher word line voltage and lower bit line voltage. When the verification conducted by a third verifier 634 occurs more than k times (k>=0, for example, k=10), a fourth loop (not shown) starts.

For the cells connected to the back-side word lines, the set algorithm 600 may be applied but with different voltages. For example, as shown in FIGS. 1 and 4, the source line voltage source provides higher voltages for the cells connected to the back-side word line WL1023 than the source line voltage source does for the cells connected to the front-side word line WL0.

FIG. 7 is an exemplary table of the set operations of the RRAM cells 110, 150 of the RRAM array 100 in FIG. 1 in accordance with some embodiments. The term "Selected" refers to those word lines, bit lines, and source lines that are connected to the RRAM cell to be set. The term "Unselected" refers to those word lines, bit lines, and source lines that are not connected to the RRAM to be set.

Referring to FIG. 1, the front-side word line WL0 is closer to the word line voltage source 192 than the back-side word line WL1023 is. That is, the wire connected between the back-side word line WL1023 and the word line voltage source 192 is longer than the wire connected between the front-side word line WL0 and the word line voltage source 192, resulting in the electrical resistance between the back-side word line WL1023 and the word line voltage source 192 that is higher than the electrical resistance between the front-side word line WL0 and the word line voltage source 192. If the word line voltage source 192 generates the same voltage (e.g., about 1.3V) for applying to the word lines WL0, WL1023, the voltage (e.g., about 1.1V) that the back-side word line WL1023 receives is lower than the voltage (e.g., about 1.3V) that the front-side word line WL0 receives due to the higher voltage drop resulting from the greater electrical resistance between the back-side word line WL1023 and the word line voltage source 192.

In order to enhance longevity and lower error rate of the RRAM array 100, a word line address dependent biasing scheme for the set operation is applied. In the operation condition 710 for setting the first RRAM cell 110, the first RRAM cell 110 is selected while the second RRAM cell 150 is not. In the operation condition 720 for setting the second RRAM cell 150, the second RRAM cell 150 is selected while the first RRAM cell 110 is not.

For example, the word line address dependent biasing includes providing different biases to the word lines WL0, WL1023 and the bit line BL0 for setting the RRAM. The word line voltage source 192 provides a voltage (e.g., about 1.3V) for setting the first RRAM cell 110 when the front-side word line WL0 is selected; the word line voltage source provides a higher voltage (e.g., about 1.4V) for setting the second RRAM when the back-side word line WL1023 is selected. This configuration compensates higher voltage drop resulting from greater electrical resistance between the back-side word line WL1023 and the word line voltage source 192.

Additionally, a bit line voltage source provides a voltage (e.g., about 1.2V) for setting the first RRAM cell 110 when the bit line BL0 is selected; the bit line voltage source provides a higher voltage (e.g., about 1.3V) for setting the second RRAM cell 150 when the bit line BL0 is selected. This configuration also improves transition of the resistor 154 of the second RRAM 150 from reset to set that would otherwise be degraded by the lower voltage at the gate of the transistor 152 of the second RRAM 150.

A ground voltage is applied during the set operation to the selected bit line BL0. A ground voltage is applied during the set operation to the unselected word lines, the unselected bit lines, and the unselected source lines.

Figure 8:
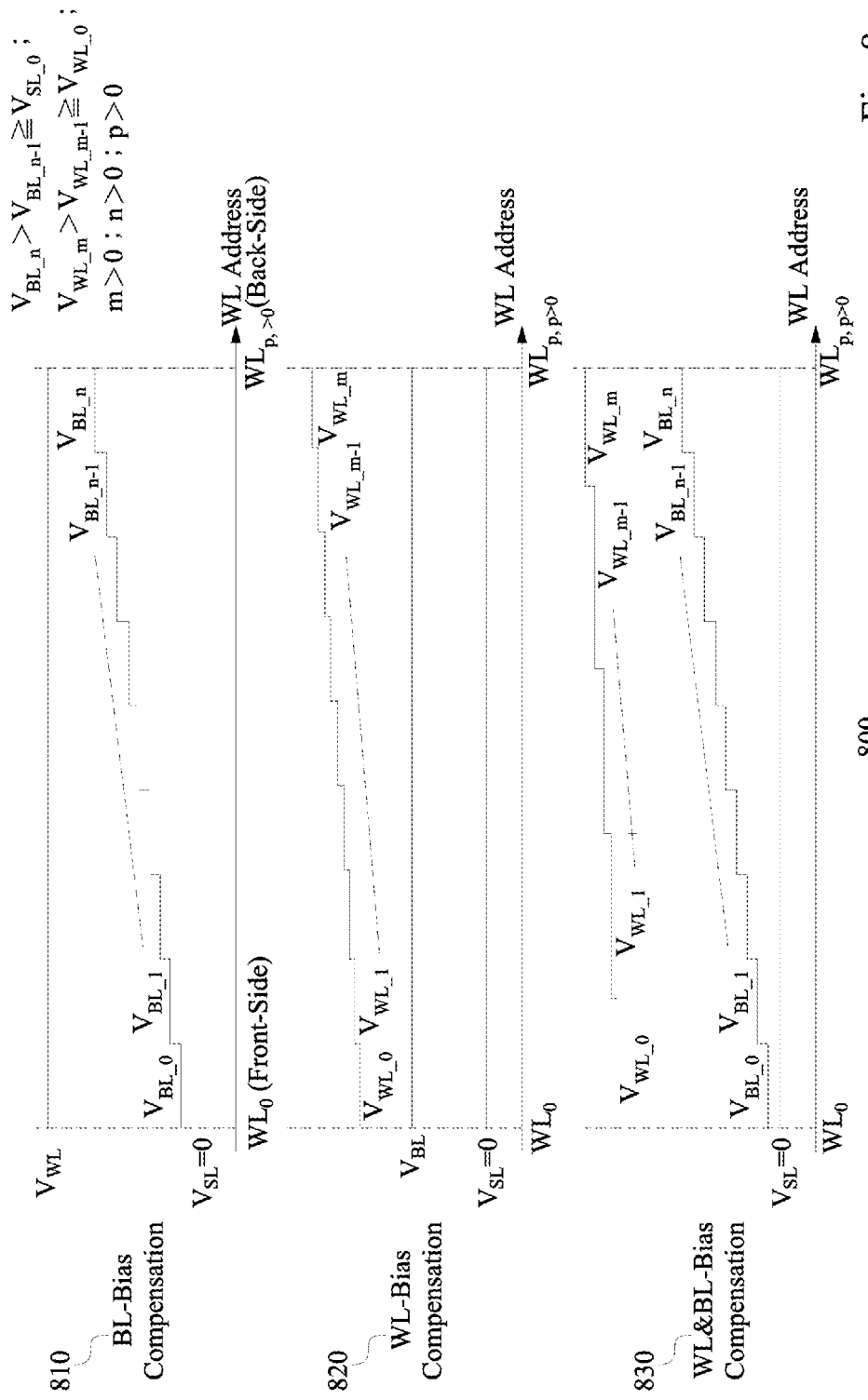
FIG. 8 is an exemplary waveform of the word line voltage source, the bit line voltage source, and the source line voltage source of the RRAM array 100 in FIG. 1 associated with the word line addresses in accordance with some embodiments.

FIG. 8 is an exemplary waveform of the word line voltage source, the bit line voltage source, and the source line voltage source of the RRAM array 100 in FIG. 1 associated with the word line addresses in accordance with some embodiments. As shown in FIG. 8 and referring to the configuration of FIG. 1, a set of waveforms of a set operation 800 is provided. The set operation 300 includes at least three configurations: a BL-bias compensation 810, a WL-bias compensation 820, and a WL&BL-bias compensation 830.

In the BL-bias compensation 810 of the set operation 800, the word line voltage source 192 provides a constant voltage. The bit line voltage source provides n incremental voltage steps associated with the word line addresses. The source line voltage source provides ground. This configuration improves transition of the resistor 154 of the second RRAM 150 from reset to set that would otherwise be degraded by the lower voltage at the gate of the transistor 152 of the second RRAM 150.

In the WL-bias compensation 820 of the set operation 800, the word line voltage source 192 provides m incremental voltage steps associated with the word line addresses. The bit line voltage source provides a constant voltage. The source line voltage source provides ground. This configuration compensates the higher voltage drop resulting from greater electrical resistance between the back-side word line WL1023 and the word line voltage source 192.

In the WL&BL-bias compensation 830 of the set operation 800, the word line voltage source 192 provides m incremental voltage steps associated with the word line addresses. The bit line voltage source provides incremental n voltage steps associated with the word line addresses as well. The source line voltage source provides ground. Such configuration combines the advantages of the two above-mentioned configurations.

Figure 9:
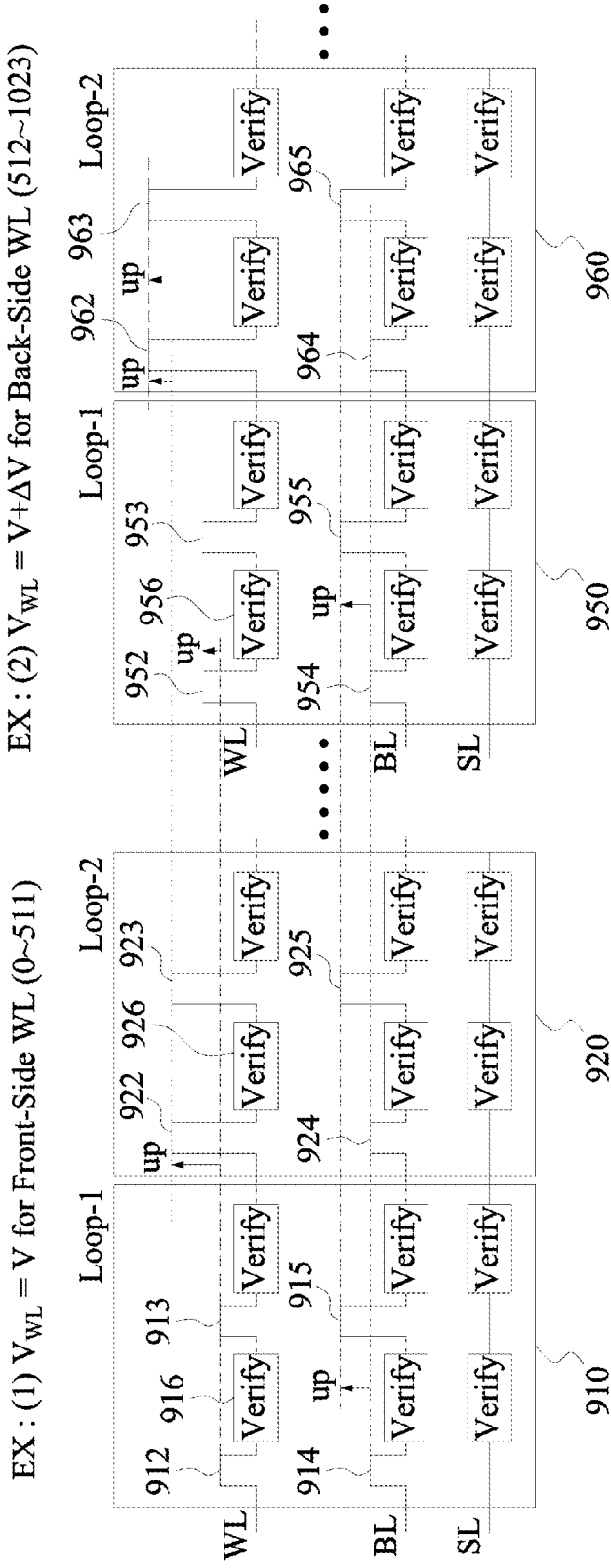
FIG. 9 is an exemplary waveform of the word line voltage source, the bit line voltage source, and the source line voltage source of the RRAM array 100 in FIG. 1 associated with the word line addresses in accordance with some embodiments.

FIG. 9 is an exemplary waveform of the word line voltage source, the bit line voltage source, and the source line voltage source of the RRAM array 100 in FIG. 1 associated with the word line addresses in accordance with some embodiments. As shown in FIG. 9 and referring to the configuration of FIG. 1, a set of waveforms of a set operation 900 is provided. The set operation 400 includes two configurations: set loops 910, 920 for the front-side word line WL0 and set loops 950, 960 for the back-side word line WL1023.

In the set loop 910 for the front-side word line WL0, the word line voltage source 192 provides pulses 912, 913 (e.g., about 1.3V) and the source line voltage source provides pulses 914, 915 (e.g., about 1.2V, 1.4V respectively). After each of the pulses (e.g., 912 and 914) for the set operation, a verification period 916 follows. In the set loop 920 for the front-side word line WL0, the word line voltage source 192 provides pulses 922, 923 (e.g., about 1.5V) and the bit line voltage source provides pulses 924, 925 (e.g., about 1.2V, 1.4V respectively). After each of the pulses (e.g., 922 and 924) for the set operation, a verification period 926 follows. In the set loop 950 for the back-side word line WL1023, compared to the set loop 910, the word line voltage source provides higher pulses 952, 953 (e.g., about 1.6V), while the bit line voltage source provides the same pulses 954, 955 (e.g., about 1.2V, 1.4V respectively). In the set loop 960 for the back-side word line WL1023, compared to the set loop 920, the word line voltage source provides higher pulses 962, 963 (e.g., about 1.7V), while the bit line voltage source provides the same pulses 964, 965 (e.g., about 1.2V, 1.4V respectively).

Figure 10:
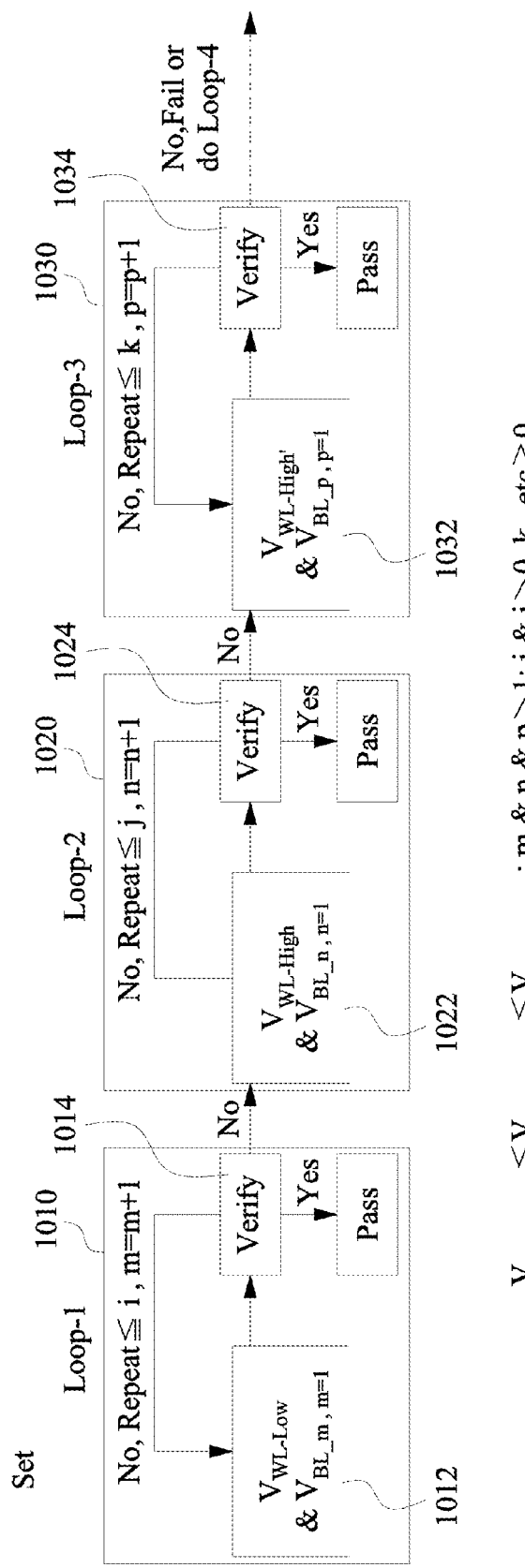
FIG. 10 is an exemplary block diagram of a set configuration for the set scheme 1000 during consecutive set loops in accordance with some embodiments.

FIG. 10 is an exemplary block diagram of a set configuration for the set scheme 1000 during consecutive set loops in accordance with some embodiments. As shown in FIG. 10, a set configuration 1000 is provided. The set configuration 1000 includes operation loops 1010, 1020, and 1030. In some embodiments, the set configuration 1000 may include more operation loops. The set configuration 1000 can be applied to the cells connected to the front-side word lines and those connected to the back-side word lines.

As shown in FIGS. 1, 9 and 10, for the cells connected to the front-side word lines, the set algorithm 1000 may be applied and start from the first operation loop 1010. The first operation loop 1010 utilizes a first voltage source 1012 including multiple voltage sources and a first verifier 1014. The first voltage source 1012 provides the pulses 912-915 to the RRAM array 100 to be set. The first verifier 1014 is electrically connected to the first variable resistor 114 and verifies whether the first variable resistor 114 is set. If the first variable resistor 114 is not set, the first verifier 1014 requests the first voltage source 1012 to repeat. When the verification conducted by the first verifier 1014 occurs more than i times (i>0, for example, i=4), the second operation loop 1020 starts.

The second operation loop 1020 utilizes a second voltage source 1022 including multiple voltage sources and a second verifier 1024. The second voltage source 1022 provides the pulses 922-925 to the RRAM 100 to be set. The second verifier 1024 is connected to the first variable resistor 114 and verifies whether the first variable resistor 114 is set. If the first variable resistor 114 is not set, the second verifier 1024 requests the second voltage source 1022 to repeat. When the verification conducted by the second verifier 1024 occurs more than j times (j>0, for example, j=6), the third operation loop 1030 starts. The third operation loop 1030 works similar to the first operation loop 1010 and the second operation loop 1020, providing higher word line voltage and lower bit line voltage. When the verification conducted by a third verifier 1034 occurs more than k times (k>=0, for example, k=10), a fourth loop (not shown) starts.

For the cells connected to the back-side word lines, the set algorithm 1000 may be applied but with different voltages. For example, as shown in FIGS. 1 and 9, the word line voltage source provides higher voltages for the cells connected to the back-side word line WL1023 than the word line voltage source does for the cells connected to the front-side word line WL0.

Figure 11:
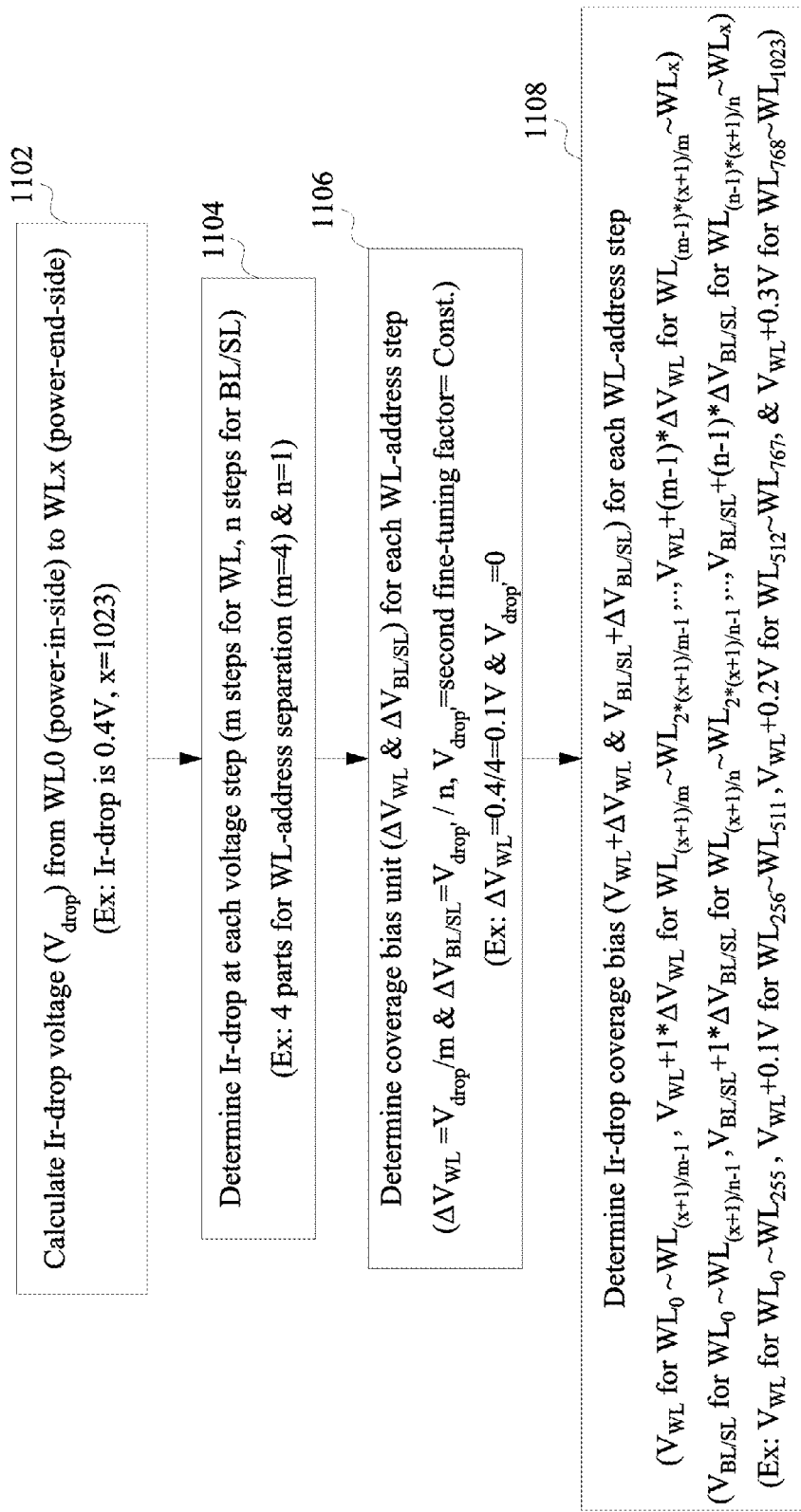
FIG. 11 is a flow chart of a method of determining address dependent biases for an RRAM in accordance with some embodiments.

FIG. 11 is a flow chart of a method of determining address dependent biases for an RRAM in accordance with some embodiments. A method 1100 of determining address dependent biases for an RRAM is provided. First, the method 1100 includes an operation 1102 of calculating Ir-drop voltage ($V_{drop}$) from WL0 (front-side) to WLx (back-side). For example, Ir-drop is 0.4V, and x (the number of word lines) is 1023. Then, the method includes an operation 1104 of determining Ir-drop at each voltage step (m steps for WL, n steps for BL/SL), for example, m=4 and n=1. The method 1100 includes an operation 1106 of determining coverage bias unit ($\Delta V_{WL}$ and $\Delta V_{BL/SL}$) for each WL-address step ($\Delta V_{WL}=V_{drop}/m$, $\Delta V_{BL/SL}=V_{drop}/n$, $V_{drop'}$ (the second fine-tuning factor) is constant). For example, $\Delta V_{WL}=0.4/4=0.1V$ and $V_{drop'}=0$.

The method 1100 includes an operation 1108 of determining Ir-drop coverage bias ($V_{BL/SL}+\Delta V_{BL/SL}$ and $V_{WL}+\Delta V_{WL}$) associated with WL-addresses. The word line voltage source provides the following voltages: $V_{WL}$ for $WL_0 \sim WL_{(x+1)/m-1}$, $V_{WL}+1*\Delta V_{WL}$ for $WL_{(x+1)/m} \sim WL_{2*(x+1)/m-1}$, ..., $V_{WL}+(m-1)*\Delta V_{WL}$ for $WL_{(m-1)*(x+1)/m} \sim WL_x$, for example, $V_{WL}$ for $WL_0 \sim WL_{255}$, $V_{WL}+0.1V$ for $WL_{256} \sim WL_{511}$, $V_{WL}+0.2V$ for $WL_{512} \sim WL_{767}$, and $V_{WL}+0.3V$ for $WL_{768} \sim WL_{1023}$. The bit line voltage source or the source line voltage source provides the following voltages: $V_{BL/SL}$ for $WL_0 \sim WL_{(x+1)/n-1}$, $V_{BL/SL}+1*\Delta V_{BL/SL}$ for $WL_{(x+1)/n} \sim WL_{2*(x+1)/n-1}$, $V_{BL/SL}+(n-1)*\Delta V_{BL/SL}$ for $WL_{(n-1)*(x+1)/n} \sim WL_x$.

It is noted that "WL" refers to "word line", "BL" refers to "bit line", "SL" refers to "source line". And "$V_{WL}$" refers to "voltage provided by the word line voltage source", "$V_{BL}$" refers to "voltage provided by the bit line voltage source", "$V_{SL}$" refers to "voltage provided by the source line voltage source".

Figure 12:
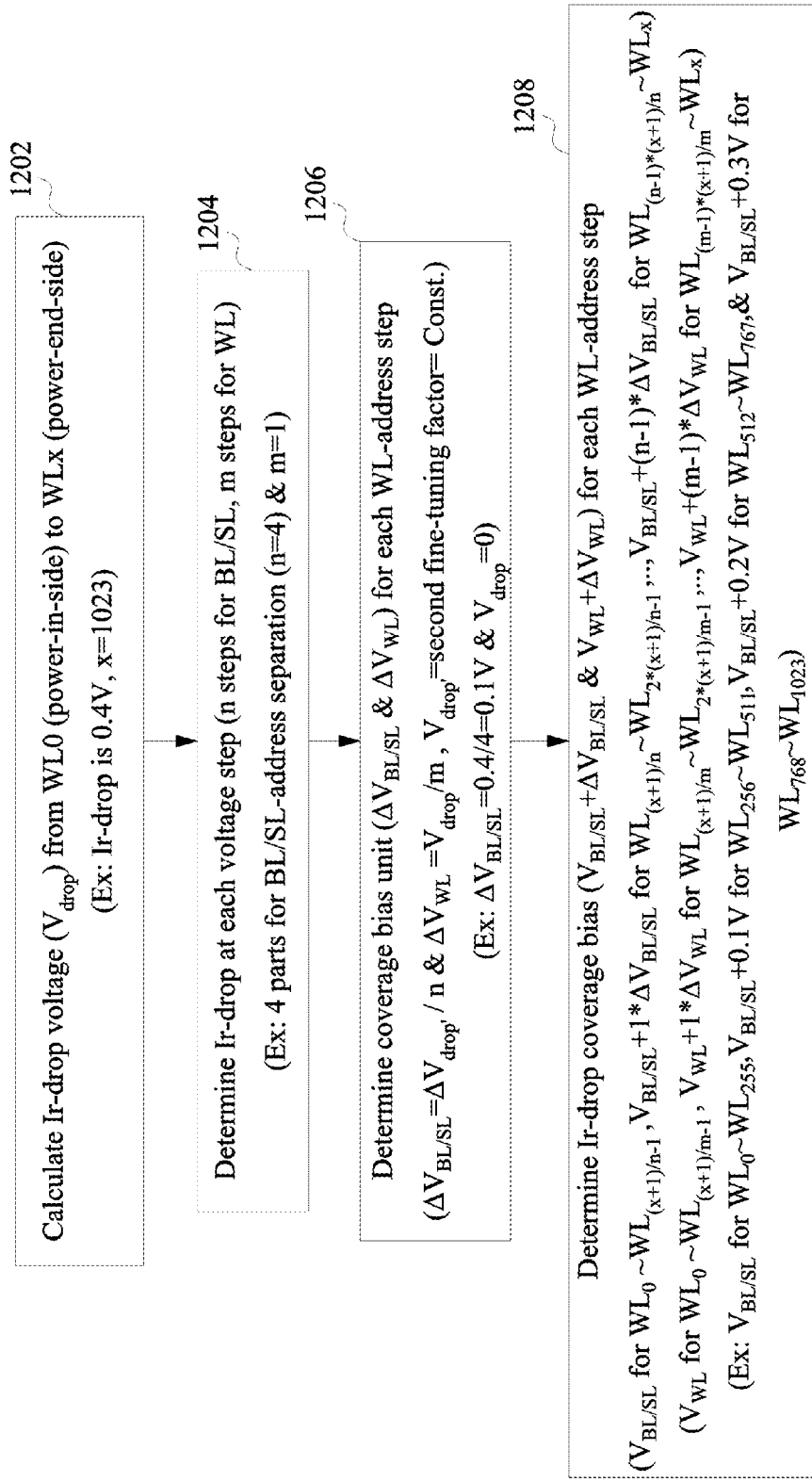
FIG. 12 is a flow chart of a method of determining address dependent biases for an RRAM in accordance with some embodiments.

FIG. 12 is a flow chart of a method of determining address dependent biases for an RRAM in accordance with some embodiments. A method 1200 of determining address dependent biases for an RRAM is provided. First, the method 1200 includes an operation 1202 of calculating Ir-drop voltage ($V_{drop}$) from WL0 (front-side) to WLx (back-side). For example, Ir-drop is 0.4V, and x (the number of word lines) is 1023. Then, the method includes an operation 1204 of determining Ir-drop at each voltage step (n steps for BL/SL, m steps for WL), for example, m=4 and n=1. The method 1200 includes an operation 1206 of determining coverage bias unit ($\Delta V_{BL/SL}$ and $\Delta V_{WL}$) for each WL-address steps ($\Delta V_{BL/SL}=V_{drop}/n$ and $\Delta V_{WL}=V_{drop}/m$, $V_{drop}$ (the second fine-tuning factor) is constant). For example, $\Delta V_{BL/SL}=0.4/4=0.1V$ and $V_{drop}=0$.

The method 1200 includes an operation 1208 of determining Ir-drop coverage bias ($V_{BL/SL}+\Delta V_{BL/SL}$ and $V_{WL}+\Delta V_{WL}$) associated with WL-addresses. The bit line voltage source or the source line voltage source provides the following voltages: $V_{BL/SL}$ for $WL_0 \sim WL_{(x+1)/n-1}$, $V_{BL/SL}+1*\Delta V_{BL/SL}$ for $WL_{(x+1)/n} \sim WL_{2*(x+1)/n-1}$, $V_{BL/SL}+(n-1)*\Delta V_{BL/SL}$ for $W_{L(n-1)*(x+1)/n} \sim WL_x$, for example, $V_{BL/SL}$ for $WL_0 \sim WL_{255}$, $V_{BL/SL}+0.1V$ for $WL_{256} \sim WL_{511}$, $V_{BL/SL}+0.2V$ for $WL_{512} \sim WL_{767}$, and $V_{BL/SL}+0.3V$ for $WL_{768} \sim WL_{1023}$. The word line voltage source provides the following voltages: $V_{WL}$ for $WL_0 \sim WL_{(x+1)/m-1}$, $V_{WL}+1*\Delta V_{WL}$ for $WL_{(x+1)/m} \sim WL_{2*(x+1)/m-1}$, $V_{WL}+(m-1)*\Delta V_{WL}$ for $WL_{(m-1)*(x+1)/m} \sim WL_x$.

According to an embodiment, a resistive random access memory (RRAM) array is provided. The RRAM array includes: a first RRAM connected to a first word line; and a second RRAM connected to a second word line, wherein a first electrical resistance between the first word line and a word line voltage source is lower than a second electrical resistance between the second word line and the word line voltage source, the word line voltage source provides a first voltage for resetting the first RRAM, the word line voltage source provides a second voltage for resetting the second RRAM, wherein the first voltage for resetting the first RRAM is lower than the second voltage for resetting the second RRAM.

According to an embodiment, a resistive random access memory (RRAM) array is provided. The RRAM array includes: a first RRAM connected to a first word line; and a second RRAM connected to a second word line, wherein a first electrical resistance between the first word line and a word line voltage source is lower than a second electrical resistance between the second word line and the word line voltage source, the word line voltage source provides a first voltage for setting the first RRAM, the word line voltage source provides a second voltage for setting the second RRAM, wherein the first voltage for setting the first RRAM is lower than the second voltage for setting the second RRAM.

According to another embodiment, a method of reset operation for a resistive random access memory (RRAM) array, having a first RRAM connected to a first word line and a second RRAM connected to a second word line, is provided. A first electrical resistance between the first word line and a word line voltage source is lower than a second electrical resistance between the second word line and the word line voltage source. The method includes: providing a first voltage by using the word line voltage source for resetting the first RRAM; and providing a second voltage by using the word line voltage source for resetting the second RRAM, wherein the first voltage for resetting the first RRAM is lower than the second voltage for resetting the second RRAM.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A resistive random access memory (RRAM) array, comprising:
 a word line voltage source configured to produce a first voltage and a second voltage, wherein in a first operation loop the first voltage is lower than the second voltage;
 a first RRAM connected to a first word line and the word line voltage source;
 a second RRAM connected to a second word line and the word line voltage source, wherein a first electrical resistance between the first word line and the word line voltage source is lower than a second electrical resistance between the second word line and the word line voltage source, the word line voltage source is configured to provide the first voltage for resetting the first RRAM, the word line voltage source is configured to provide the second voltage for resetting the second RRAM; and
 a verifier configured to determine whether the first and second RRAM were successfully reset, the word line voltage source being configured to provide, in a second operation loop, first and second voltages that are higher than the respective first and second voltages provided in the first operation loop, the word line voltage source providing the higher first and second voltages based on a determination by the verifier that the first and second RRAM were not successfully reset.

2. The RRAM array of claim 1, further comprising:
 a first source line connected to the first RRAM;
 a second source line connected to the second RRAM; and
 a source line voltage source configured to provide a third voltage for resetting the first RRAM when connected to the first source line, and configured to provide a fourth voltage for resetting the second RRAM when connected to the second source line, wherein in the first operation loop the third voltage is lower than the fourth voltage.

3. The RRAM array of claim 2, wherein the source line voltage source is configured to provide lower voltages in the second operation loop than were provided by the source line voltage source in the first operation loop based on the determination by the verifier that the first and second RRAM were not successfully reset.

4. The RRAM array of claim 1, wherein each of the first RRAM and the second RRAM comprises:
 a resistor comprising a cap side electrode and a dielectric side electrode, wherein the cap side electrode of the resistor of the first RRAM is grounded for resetting the first RRAM, and the cap side electrode of the resistor of the second RRAM is grounded for resetting the second RRAM; and
 a transistor, wherein a drain of the transistor is electrically connected to the dielectric side electrode of the resistor and a gate of the transistor of the first RRAM is electrically connected to the first word line, a gate of the transistor of the second RRAM is electrically connected to the second word line.

5. The RRAM array of claim 3, wherein, in the first operation loop, the source line voltage source is configured to provide about 1.6V for resetting the first RRAM, and the source line voltage source is configured to provide about 1.7V for resetting the second RRAM.

6. The RRAM array of claim 3, wherein, in the second operation loop, the source line voltage source is configured to provide about 1.5V for resetting the first RRAM, and the source line voltage source is configured to provide about 1.6V for resetting the second RRAM.

7. The RRAM array of claim 4, wherein the resistor is further connected to the verifier for verifying whether the resistor is reset, wherein if not, the verifier starts a third operation loop.

8. A resistive random access memory (RRAM) array, comprising:
 a word line voltage source configured to produce a first voltage and a second voltage, wherein in a first operation loop the first voltage is lower than the second voltage;
 a first RRAM connected to a first word line and the word line voltage source;
 a second RRAM connected to a second word line and the word line voltage source, wherein a first electrical resistance between the first word line and the word line voltage source is lower than a second electrical resistance between the second word line and the word line voltage source, the word line voltage source is configured to provide the first voltage for setting the first RRAM, the word line voltage source is configured to provide the second voltage for setting the second RRAM; and a verifier configured to determine whether the first and second RRAM were successfully set, the word line voltage source being configured to provide, in a second operation loop, first and second voltages that are higher than the respective first and second voltages provided in the first operation loop, the word line voltage source providing the higher first and second voltages based on a determination by the verifier that the first and second RRAM were not successfully set.

9. The RRAM array of claim 8, further comprising:
a first bit line connected to the first RRAM;
a second bit line connected to the second RRAM; and
a bit line voltage source configured to provide a third voltage for setting the first RRAM when connected to the first bit line, and providing a fourth voltage for setting the second RRAM when connected to the second bit line, wherein in the first operation loop the third voltage is lower than the fourth voltage.

10. The RRAM array of claim 8, wherein each of the first RRAM and the second RRAM comprises:
a resistor comprises a cap side electrode and a dielectric side electrode, wherein the cap side electrode of the resistor of the first RRAM is connected to the first bit line, and the cap side electrode of the resistor of the second RRAM is connected to the second bit line; and
a transistor, wherein a drain of the transistor is electrically connected to the dielectric side electrode of the resistor, and a gate of the transistor of the first RRAM is electrically connected to the first word line, a gate of the transistor of the second RRAM is electrically connected to the second word line, a source of the resistor of the first RRAM is grounded for setting the first RRAM, and a source of the resistor of the second RRAM is grounded for setting the second RRAM.

11. The RRAM array of claim 8, wherein, in the first operation loop, the word line voltage source is configured to provide about 1.3V for setting the first RRAM, and the word line voltage source is configured to provide about 1.4V for setting the second RRAM.

12. The RRAM array of claim 8, wherein, in the second operation loop, the word line voltage source is configured to provide about 1.4V for setting the first RRAM, and the word line voltage source is configured to provide about 1.5V for setting the second RRAM.

13. The RRAM array of claim 10, wherein the resistor is further connected to the verifier for verifying whether the resistor is set, wherein if not, the verifier starts a third operation loop.

14. A method of reset operation for a resistive random access memory (RRAM) array having a first RRAM connected to a first word line and a second RRAM connected to a second word line, the method comprising:
providing, in a first operation loop, a first voltage on the first word line for resetting the first RRAM;
providing, in the first operation loop, a second voltage on the second word line for resetting the second RRAM, wherein in the first operation loop the first voltage for resetting the first RRAM is lower than the second voltage for resetting the second RRAM,
determining whether the first and second RRAM were successfully reset as a result of the first operation loop;
providing, in a second operation loop, a first voltage on the first word line that is higher than the first voltage provided in the first operation loop based on a determination that the first RRAM was not successfully reset; and
providing, in the second operation loop, a second voltage on the second word line that is higher than the second voltage provided in the first operation loop based on a determination that the second RRAM was not successfully reset.

15. The method of claim 14, wherein the first RRAM is connected to a first source line and the second RRAM is connected to a second source line, further comprising:
providing a third voltage on the first source line for resetting the first RRAM; and
providing a fourth voltage on the second source line for resetting the second RRAM,
wherein the third voltage for resetting the first RRAM is lower than the fourth voltage for resetting the second RRAM.

16. The method of claim 15, wherein the method further comprises providing a lower voltage respectively on a first source line and a second source line in the second operation loop than in the first operation loop based on the determination that the first and second RRAM were not successfully reset.

17. The method of claim 14, further comprising:
providing ground to a cap side electrode of a resistor of the first RRAM for resetting the first RRAM; and
providing ground to a cap side electrode of a resistor of the second RRAM for resetting the second RRAM.

18. The RRAM array of claim 1,
wherein the first and second word lines are associated with respective first and second word line addresses,
wherein the word line voltage source is configured to generate voltages that vary according to m discrete, incremental steps, m being greater than two, and each of the voltage steps being associated with one or more word line addresses,
wherein the first voltage is determined based on a voltage step of the m voltage steps that is associated with the first word line address, and
wherein the second voltage is determined based on a voltage step of the m voltage steps that is associated with the second word line address.

19. The RRAM array of claim 8,
wherein the first and second word lines are associated with respective first and second word line addresses,
wherein the word line voltage source is configured to generate voltages that vary according to m discrete, incremental steps, m being greater than two, and each of the voltage steps being associated with one or more word line addresses,
wherein the first voltage is determined based on a voltage step of the m voltage steps that is associated with the first word line address, and
wherein the second voltage is determined based on a voltage step of the m voltage steps that is associated with the second word line address.

20. The method of claim 14, wherein the first and second word lines are associated with respective first and second word line addresses, the method further comprising:
generating voltages that vary according to m discrete, incremental steps, m being greater than two, and each of the voltage steps being associated with one or more word line addresses;
determining the first voltage based on a voltage step of the m voltage steps that is associated with the first word line address; and
determining the second voltage based on a voltage step of the m voltage steps that is associated with the second word line address.

* * * * *